United States Patent [19]
Dumont

[11] 4,359,604
[45] Nov. 16, 1982

[54] APPARATUS FOR THE DETECTION OF VOICE SIGNALS

[75] Inventor: François Dumont, Paris, France

[73] Assignee: Thomson-CSF, Paris, France

[21] Appl. No.: 190,894

[22] Filed: Sep. 25, 1980

[30] Foreign Application Priority Data

Sep. 28, 1979 [FR] France .................. 79 24227

[51] Int. Cl.³ .................................. H04B 15/00
[52] U.S. Cl. .................... 179/1 SC; 179/1 VC
[58] Field of Search ............ 179/1 SC, 1 VC, 1 P; 455/79, 218, 221; 375/5, 104

[56] References Cited

U.S. PATENT DOCUMENTS

| | | | |
|---|---|---|---|
| 3,712,959 | 1/1973 | Fariello | 179/1 VC |
| 3,832,491 | 8/1974 | Sciulli et al. | 179/1 VC |
| 4,052,568 | 10/1977 | Jankowski | 179/1 SC |
| 4,187,396 | 2/1980 | Luhowy | 179/1 SC |

*Primary Examiner*—Emanuel S. Kemeny
*Attorney, Agent, or Firm*—Cushman, Darby & Cushman

[57] ABSTRACT

A detection apparatus for receiving an input signal containing noise and for detecting the presence of voice signals therein comprises means for attenuating the input signal and a comparator of the amplitude of the attenuated input signal relative to a variable threshold voltage. This threshold voltage is generated by control means which make the threshold voltage dependent on the peak amplitude value of the input signal. A control signal corresponding to the detection of voice signals is supplied by decision means which carry out a time analysis of the output signal of the comparator.

4 Claims, 2 Drawing Figures

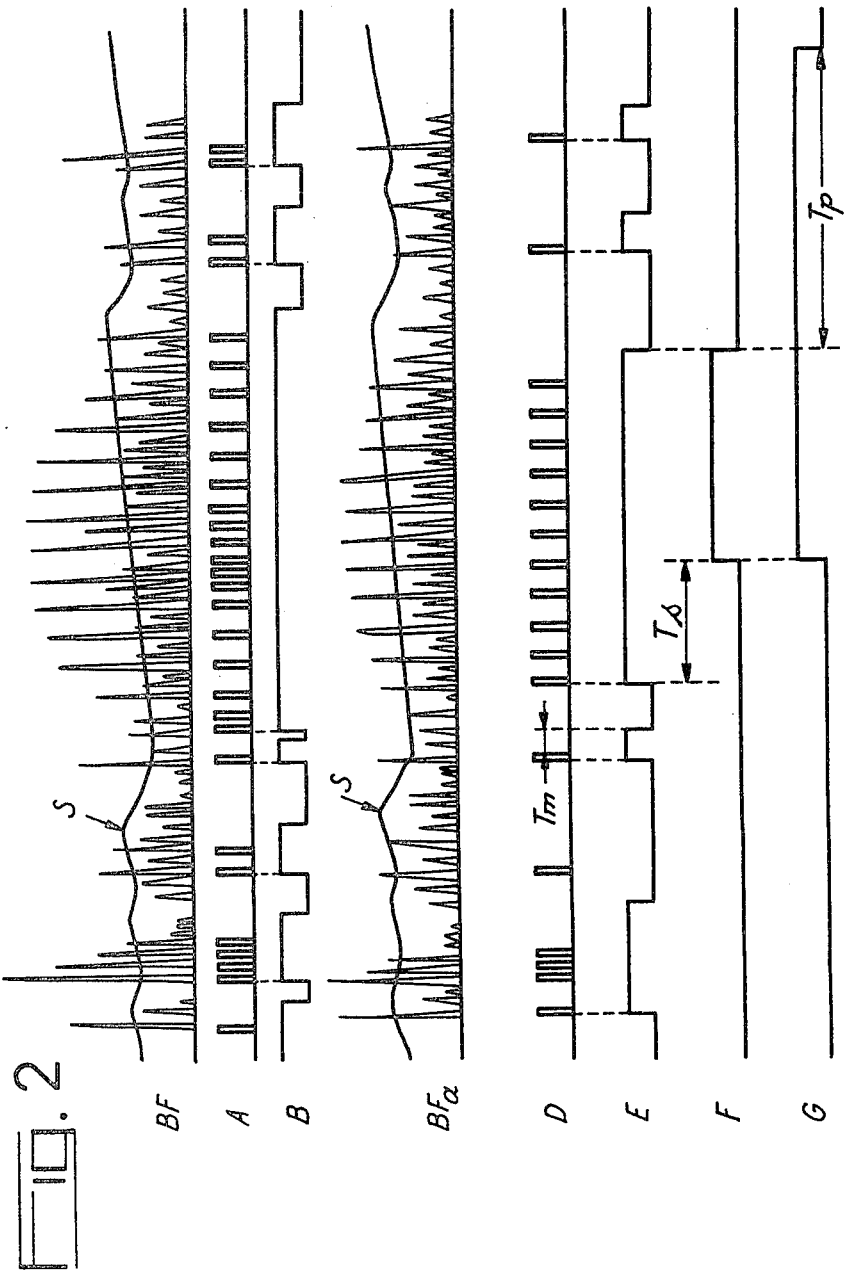

APPARATUS FOR THE DETECTION OF VOICE SIGNALS

BACKGROUND OF THE INVENTION

The present invention relates to an apparatus for the detection of voice signals in an input signal and in particular when such apparatus are used in alternation systems.

Such apparatus supply logic data, indicating the presence or absence of a word and can be used, for example, for controlling a switch in order to discriminate the voice signals with respect to the input signal.

Any truncation of the start or finish of voice activity is generally eliminated by adding a delay line which precedes the switch and delays the audiofrequency input signal.

It is known to produce alternating voice control apparatus of simple construction based on the comparison of the energy of the input signal and a fixed threshold. However, in the presence of noise, such apparatus are inadequate.

More efficient apparatus, essentially based on the spectral analysis of the signal are also known, but they suffer from a complicated construction.

BRIEF SUMMARY OF THE INVENTION

The present invention aims at obviating the disadvantages referred to hereinbefore using simple means.

The present invention therefore relates to a detection apparatus for receiving an input signal containing noise and for detecting therein the presence of voice signals comprising non-linear means for making a threshold voltage dependent on the peak amplitude of the input signal, attenuation means in a ratio k (k equals positive integer which is not zero) for receiving the input signal and having an output for supplying an attenuated signal, means for comparing the amplitude of the attenuated signal with the threshold voltage having an output for supplying a first intermediate control signal when the amplitude of the attenuated signal exceeds the threshold voltage and decision means coupled to the output of the comparison means for carrying out a time analysis of the number of times the amplitude of the attenuated signal exceeds the threshold voltage in order to supply a main control signal corresponding to a detection of the presence of voice signals.

BRIEF DESCRIPTION OF THE DRAWINGS

The invention is described in greater detail hereinafter relative to non-limitative embodiments and the attached drawings, wherein show:

FIG. 2 the chronogram of signals making it possible to explain the operation of the apparatus according to FIG. 1.

DETAILED DESCRIPTION OF THE PREFERRED EMBODIMENTS

Figure 1:
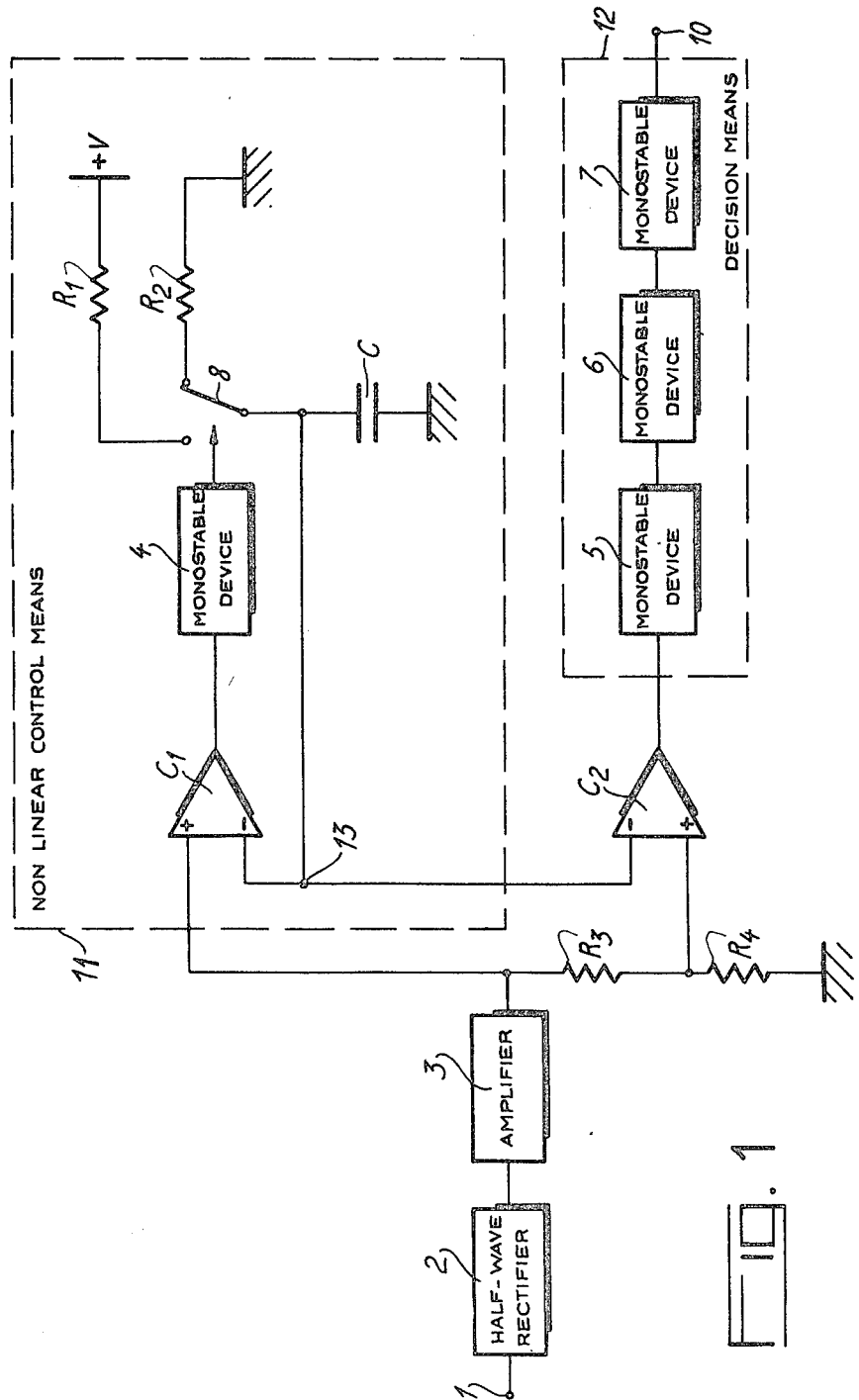
FIG. 1 an exemplified embodiment of the apparatus according to the invention.

In FIG. 1, an input terminal 1 for receiving an input signal constituted by a speech signal mixed with noise is coupled to the input of an amplifier 3 across a half-wave rectifier 2. The output of amplifier 3 is coupled to the positive input of a comparator $C_2$ across a resistor $R_3$ and to the positive input of a comparator $C_1$. The positive input of comparator $C_2$ is also coupled to earth across a resistor $R_4$. The negative inputs of comparators $C_1$ and $C_2$ are coupled to earth across a capacitor C and to one end of a switch 8. Switch 8 makes it possible to couple said end either to a voltage supply "+V" across a resistor $R_1$ or to earth across a resistor $R_2$. The output of comparator $C_1$ is coupled to the control input of switch 8 across a first monostable device 4. The output of comparator $C_2$ is coupled to an output terminal 10 across a second monostable device 5, a third monostable device 6 and a fourth monostable device 7 arranged in series.

The assembly formed by comparator $C_1$, the first monostable device 4, switch 8, comparator C and resistors $R_1$ and $R_2$ constitutes means 11 for bringing about the non-linear dependence of a threshold voltage. In the same way, the second, third and fourth monostable devices 5, 6, 7 form decision means 12.

Before describing the operation of this apparatus, it is useful to refer to the various sounds constituting a voice signal and which can be classified as voiced or unvoiced depending on the way in which they are produced.

Voiced sounds are constituted either by vowels or by liquid or voiced consonants and have clearly defined spectral properties which do not occur in voiceless sounds constituted by voiceless consonants. Voiced sounds, whose amplitude is generally much higher than that of voiceless sounds have a very marked periodicity level with the time signal. This periodicity, which does not exist with voiceless sounds, is due to the vibration of the vocal chords. The value of the frequency corresponding to this periodicity, called the pitch frequency, can be between approximately 60 and 300 Hz, depending on the person concerned.

It is therefore obviously easier to discriminate with respect to noise voiced sounds rather than voiceless sounds which, either by their amplitudes and spectral characteristics are generally "swamped" in the background noise.

In order to guarantee maximum performance characteristics, the apparatus of FIG. 1 makes it possible to optimise the discrimination for voiced sounds. For this purpose, the decision regarding the presence or absence of the words is processed on the basis of the analysis of the instantaneous amplitude of the voice signal, rather than its energy and this takes place in three stages:

(a) In non-linear manner, a threshold voltage is made dependent on the peak amplitude value of the input signal in order to become free of the absolute value of the background noise, whilst retaining as the discrimination parameter only the relative value of the speech amplitude ratio on the noise. This is brought about by control means 11, which supply a threshold voltage, which either exponentially rises as a function of time in accordance with a time constant $\tau_m$ when the instantaneous amplitude of the audiofrequency input signal exceeds the threshold voltage, or exponentially drops in accordance with a time constant $\tau_d$ when the instantaneous amplitude of the input signal is below the threshold voltage.

(b) Comparison of the instantaneous amplitude of the audiofrequency input signal attenuated by a ratio k (k=non-zero integer) with respect to the threshold voltage generated by the control means 11. This comparison is carried out by comparator $C_2$ which supplies a logic signal of level 1 when this amplitude exceeds the threshold voltage.

(c) Time analysis of the output signal of comparator $C_2$ so as to exploit the special characteristics of voiced sounds and extension by proximity of the voice activity decision (procedure described in Thomson-CSF French Pat. No. 2,380,612) for obviating truncations of voiceless sounds. Voiceless sounds which, with few exceptions, can be likened to consonants, are almost always directly preceded or followed by a vowel, i.e. a voiced sound. Under these conditions, it is merely necessary to prolong the decision taken on a voiced sound by a few dozen milliseconds on either side to prevent truncations. In practice, the input signal is delayed in a delay line and the activity decision taken on a voiced sound is extended by twice the delay provided by the delay line.

Moreover, the time analysis of the output signal of comparator $C_2$ is performed on the basis of the double time criterion making it possible to exploit on the one hand the pitch frequency by testing the maximum time separating two transitions from state 0 to state 1 of the analysed signal and on the other hand the syllabic frequency by testing the time during which these timed transitions exist.

Time analysis of the output signal of comparator $C_2$ and extension by proximity of the voice activity detection are performed by decision means 12. The latter decide whether voiced sounds are present when the three following conditions are simultaneously fulfilled:

(1) The instantaneous amplitude of the audiofrequency signal exceeds the variable threshold voltage.
(2) The time separating two transitions from state 0 to state 1 of the output signal of comparator $C_2$ does not exceed an upper bound $T_m$ of the pitch period.
(3) These transitions last a time at least equal to a lower bound $T_s$ of the syllabic period.

These conditions were established so as to be satisfactory in the presence of voiced sounds with a sufficient energy, provided that the threshold voltage only varies very slightly during detection.

As a result, the time constant $\tau_m$ for the rise in the variable threshold voltage must exceed the syllabic period. For this purpose, the value of said time constant $\tau_m$ during a rise is selected approximately 5 s. Moreover, to retain the same detection performances over a continuous vocal flow, it is necessary for the threshold voltage to rapidly drop to the level of the noise between two syllables, so that the drop time constant $\tau_d$ is much smaller than that of the rise time constant. For this purpose, the value of constant $\tau_d$ is approximately 200 ms.

Moreover, in view of the aforementioned detection criteria, the immunity to noise is based on the threshold voltage control means. The threshold voltage must have a value such that in the presence of noise at least one of the three aforementioned detection conditions is not satisfied.

It is possible to establish three different types of noise which can easily be rejected by imposing the threshold voltage control conditions.

Thus, for noise of the "modulated stationary" type, whose mean energy variations are very slow, but which have a significant modulation at a frequency equal to or higher than the pitch frequency, decision conditions 2 and 3 are generally satisfied. To prevent condition 1 from also being satisfied in the presence of such a noise, the threshold voltage must be regulated on the amplitude peaks, whose repetition frequency can coincide with the pitch frequency. This condition can be fulfilled by extending the threshold voltage rise control by a time at least equal to $T_m$ (maximum melody period) after the instantaneous amplitude of the audiofrequency signal has dropped below the threshold voltage again. This function is fulfilled by the monostable device 4 of FIG. 1.

Noise of the "stationary white" type, whose mean energy variations, like those of the previous category, are relatively slow, has no melodic periodicity, but instead an amplitude distribution whose probability density decreases rapidly when the amplitude increases (e.g. of the Gaussian type). In the case of such noise, the instantaneous amplitude can assume very high values and the decision condition 1 is generally fulfilled. However, it is possible to reject such a noise if during time $T_s$ the probability of the threshold voltage being exceeded several times by the amplitude of the signal separated by a time below $T_m$ is almost zero (i.e. conditions 2 and 3 are not fulfilled). This can be brought about by attenuating the signal which is compared at the threshold voltage for the vocal activity decision with the signal used for generating the threshold voltage. Thus, in the presence of noise of this type, the control system regulates the mean value of the threshold voltage as a function of the probability of the threshold voltage being exceeded by the amplitude of the unattenuated input signal. This probability is fixed by the parameters $T_m$ and $\tau_m/\tau_d$. The choice of the attenuation factor k consequently makes it possible to displace towards zero the probability of the threshold voltage being exceeded by the attenuated signal in the case of a noise, without substantially modifying this intersection probability in the presence of voiced sounds. This attenuation function is fulfilled by the potentiometric divider formed by the two resistors $R_3$ and $R_4$.

Finally "impulse" type noise, whose duration is below $T_s$ no matter what their energies or the frequencies which they contain, generally lead to the instantaneous amplitude of the signal exceeding the threshold voltage and thus satisfy decision conditions 1 and 2. Only condition 3 makes it possible to reject such noise.

The practical realisation of the decision means utilizing decision criteria 1, 2 and 3 and threshold voltage control means having the characteristics defined hereinbefore can be achieved in simple manner using the elements described in FIG. 1. The operating chronogram of these elements is given in FIG. 2.

FIG. 2 shows signals BF, A, B, $BF_a$, D, E, F and G respectively present at the output of amplifier 3, at the output of comparator $C_1$, at the output of monostable device 4, at the positive input of comparator $C_2$, at the output of comparator $C_2$, at the output of monostable device 5, at the output of monostable device 6 and at the output of monostable device 7. The amplitude of the threshold voltage S has been superimposed on signals BF and $BF_a$.

Signal BF, present at the output of amplifier 3, corresponds to the audiofrequency input signal half-wave rectified by rectifier 2, then amplified by amplifier 3 to cover the maximum amplitude range. The amplitude of signal BF is then compared with the variable threshold voltage S by comparator $C_1$. This comparator supplies the logic signal A which passes to the upper state when the instantaneous amplitude of signal BF exceeds the threshold voltage and to the lower state in the opposite case. This signal is applied to the input of the monostable device 4, whose logic output signal B passes to the upper state at the same time as its input signal, but only passes to the lower state again $T_m$ milliseconds after its input signal has been stabilised at the lower state. $T_m$ which is equal to 16 ms represents an upper bound of the pitch period present in the voice signal.

The output signal B of monostable device 4 controls an asymmetrical integrator constituted by resistors $R_1$ and $R_2$, switch 8 and capacitor C. Output 13 of this integrator supplies the variable threshold voltage in such a way that when the control signal B is in the upper state the threshold voltage value increases by an exponential law of time constant $R_1C$ of approximately 5 s and when the control signal is in the lower state the threshold voltage value decreases in accordance with the same law, but with a time constant $R_2C$ of approximately 200 ms.

The potentiometric divider formed by resistors $R_3$ and $R_4$ makes it possible to attenuate the output signal BF of amplifier 3 by a ratio k. The attenuated signal $BF_a$ is then compared with the variable threshold voltage by comparator $C_2$. The output signal D of comparator $C_2$ is applied to the input of a monostable device 5, whose logic output signal E passes to the upper state when the amplitude value of signal $BF_a$ rises above the threshold voltage and only passes to the lower state again $T_m$ milliseconds after the amplitude of signal $BF_a$ has again dropped below the threshold. Logic signal E is applied to the input of monostable device 6. The logic output signal F of monostable device 6 only passes to the upper state $T_s$ milliseconds after its input signal has been stabilised at the upper level and only returns to the lower state again in synchronism with its input signal. The final monostable device 7 supplies a logic signal G which passes to the upper state at the same time as the output signal F of monostable device 6 and thus indicates the presence of voiced sound. Signal G indicates the end of these voiced sounds when it again passes to the lower state $T_p$ milliseconds after the output signal F of monostable device 6, $T_p$ being equal to $T_s$ plus twice 20 ms and constitutes the extension by proximity. To discriminate the voice signals with respect to signal BF, it is merely necessary, for example, to control a switch (not shown) by means of signal G.

Moreover, a not shown delay lines associated with the detector delays the audiofrequency delays signal BF by $T_s$ plus 20 ms in order to eliminate the delay between decision signal G and audiofrequency signal BF.

The apparatus described hereinbefore has the advantage of an almost total immunity to any noise having slow variations no matter what the level and to any impulse noise whose duration is below approximately 50 ms no matter what the amplitude.

Moreover, the detection of voiced sounds takes place with a good time precision, despite a low signal-to-noise ratio.

Finally, the apparatus described hereinbefore is able to eliminate any truncation of the start or finish of voice activity due to the addition of a delay line making it possible to delay the audiofrequency signal.

The invention is not limited to the specific embodiments described and represented and numerous variants are possible thereto without passing beyond the scope of the invention, this particularly relating to the non-linear control means generating a threshold voltage having the characteristics defined hereinbefore.

What is claimed is:

1. A detection apparatus for receiving an input signal containing noise and for detecting therein the presence of voice signals comprising:
   a threshold voltage generator having a control input and an output for supplying a threshold voltage which either rises exponentially as a function of time in accordance with a first time constant which exceeds a maximum syllable period, or drops exponentially in accordance with a second time constant which exceeds the maximum pitch period;
   control means having a first and a second input for respectively receiving the input signal and the threshold voltage and an output coupled to the control input of the generator for supplying a control signal making the threshold voltage rise as long as the input signal peak amplitude is greater than the threshold voltage, and making it drop in the opposite case;
   attenuation means in a ratio k (k being equal to a positive integer which is not zero) for receiving the input signal and having an output for supplying an attenuated signal;
   comparison means for comparing the amplitude of the attenuated signal with the threshold voltage and having an output for supplying a first intermediate signal when the amplitude of the attenuated signal exceeds the threshold voltage;
   decision means coupled to the output of the comparison means for supplying a signal corresponding to a detection of voice signal when the first intermediate signal shows a burst of transitions whose total duration is greater than $T_S$ (the lower bound of the syllabic period) and when each two successive transitions in the same direction is separated by a time interval lower than Tn (the upper bound of the pitch period).

2. A detection apparatus according to claim 1, wherein the decision means comprises a first timing device having an input coupled to the output of the comparison means and an output for supplying a second intermediate signal corresponding to the first intermediate signal extended by a duration equal to Tm, and a second timing device having an input coupled to the output of the first timing device and an output being the output of the decision means and supplying a signal when the duration of the first signal exceeds $T_S$.

3. A detection apparatus according to claim 2, wherein the control means comprises a comparator having a first input receiving the input signal and a second input receiving the threshold voltage supplied by the generator and an output for supplying an intermediate control signal when the input signal peak amplitude exceeds the threshold voltage, and a timing device having an input coupled to the comparator output and an output coupled to the output fo the control means for supplying a control signal which is the intermediate control signal extended by a duration equal or greater than Tm.

4. A detection apparatus according to claim 2, wherein the voltage generator comprises a switch having a control input being the control input of the generator, a voltage supply, a first resistor, a second resistor, a capacitor having a first end coupled to earth and a second end coupled either to earth across the first resistor or to the voltage supply across the second resistor, said second end constituting the output of the generator.

* * * * *